US007408772B2

(12) United States Patent
Grady et al.

(10) Patent No.: US 7,408,772 B2
(45) Date of Patent: Aug. 5, 2008

(54) FAN TRAY ELECTRONICS ENCLOSURE

(75) Inventors: John R. Grady, Cypress, TX (US); Ray G. Basinger, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 446 days.

(21) Appl. No.: 10/846,031

(22) Filed: May 14, 2004

(65) Prior Publication Data

US 2005/0254210 A1 Nov. 17, 2005

(51) Int. Cl.
*H05K 7/20* (2006.01)

(52) U.S. Cl. ........................ 361/687; 361/727; 165/122

(58) Field of Classification Search ................. 361/687, 361/695, 727; 165/122

See application file for complete search history.

(56) References Cited

U.S. PATENT DOCUMENTS 4,739,445 A 4/1988 Tragen
4,767,262 A * 8/1988 Simon ........................ 415/119
5,460,441 A 10/1995 Hastings et al.
5,927,389 A * 7/1999 Gonsalves et al. .......... 165/121
6,115,250 A * 9/2000 Schmitt ...................... 361/695
6,137,678 A 10/2000 Gebara et al.
6,388,880 B1 5/2002 El-Ghobashy et al.
6,392,893 B1 * 5/2002 Carney et al. ............... 361/727
6,477,055 B1 11/2002 Bolognia et al.
6,556,437 B1 4/2003 Hardin
6,556,438 B1 4/2003 Bolognia et al.
6,574,100 B1 * 6/2003 Anderson ................... 361/687
6,603,661 B2 8/2003 Smith et al.
6,665,179 B2 * 12/2003 Chou ......................... 361/687
6,714,411 B2 3/2004 Thompson et al.
6,741,463 B1 * 5/2004 Akhtar et al. ............... 361/686
6,836,030 B2 12/2004 Smith et al.
6,839,233 B2 * 1/2005 Cravens et al. .............. 361/695
6,842,334 B2 1/2005 Smith et al.
6,853,551 B2 * 2/2005 Baar et al. .................. 361/687
6,867,966 B2 * 3/2005 Smith et al. ................. 361/687
6,909,611 B2 6/2005 Smith et al.
6,985,358 B2 * 1/2006 Thompson et al. .......... 361/695
6,988,626 B2 * 1/2006 Varghese et al. .............. 211/26
2002/0094772 A1 7/2002 Gough
2003/0112601 A1 6/2003 Smith et al.
2003/0123222 A1 7/2003 Thompson et al.
2003/0223193 A1 12/2003 Smith et al.
2003/0223196 A1 12/2003 Smith et al.
2005/0157461 A1 * 7/2005 Cauthron .................... 361/683
2007/0081888 A1 * 4/2007 Harrison ...................... 415/47

FOREIGN PATENT DOCUMENTS

JP 02001177281 A * 6/2001

OTHER PUBLICATIONS

US 6,680,846, 01/2004, Smith et al. (withdrawn)

* cited by examiner

*Primary Examiner*—Lisa Lea-Edmonds
*Assistant Examiner*—Ingrid Wright

(57) ABSTRACT

A fan tray for mounting in a housing to move between a retracted position within the housing and an extended position at which the fan tray extends from the front of the housing. The fan tray may comprise a flow passage having fan receptacles adapted to support removable fans such that the fans are operable to provide continuous airflow through the flow passage. In one embodiment, the housing may be provided by a blade server through which the fans direct air for cooling purposes.

33 Claims, 8 Drawing Sheets

382

386
380
388
266
390
392
302
384
360

FAN TRAY ELECTRONICS ENCLOSURE

BACKGROUND OF THE RELATED ART

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the computer industry, a rack-mount computer system often has a plurality of rack-mount components, such as servers, which are configured to facilitate reliable and continuous operation. In certain systems, these rack-mount components have redundant devices, such as multiple power supplies and fans. If one of these components fails or malfunctions, then the redundant component continues operations of the system until a service technician can subsequently replace the failed component. Some systems provide hot-plug components, which enable a service technician to replace the failed component during operation of the system. Unfortunately, many redundant components are entirely within the chassis of the rack-mount component, such that they are inaccessible without removing the rack-mount component from a rack structure. As a result, the replacement of the failed component can create downtime.

SUMMARY

A fan tray for mounting in a housing to move between a retracted position within the housing and an extended position at which the fan tray extends from the front of the housing. The fan tray may comprise a flow passage having fan receptacles adapted to support removable fans such that the fans are operable to provide continuous airflow through the flow passage. In one embodiment, the housing may be provided by a blade server through which the fans direct air for cooling purposes.

BRIEF DESCRIPTION OF THE DRAWINGS

Advantages of one or more disclosed embodiments may become apparent upon reading the following detailed description and upon reference to the drawings in which.

DETAILED DESCRIPTION

One or more specific embodiments of the present technique will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
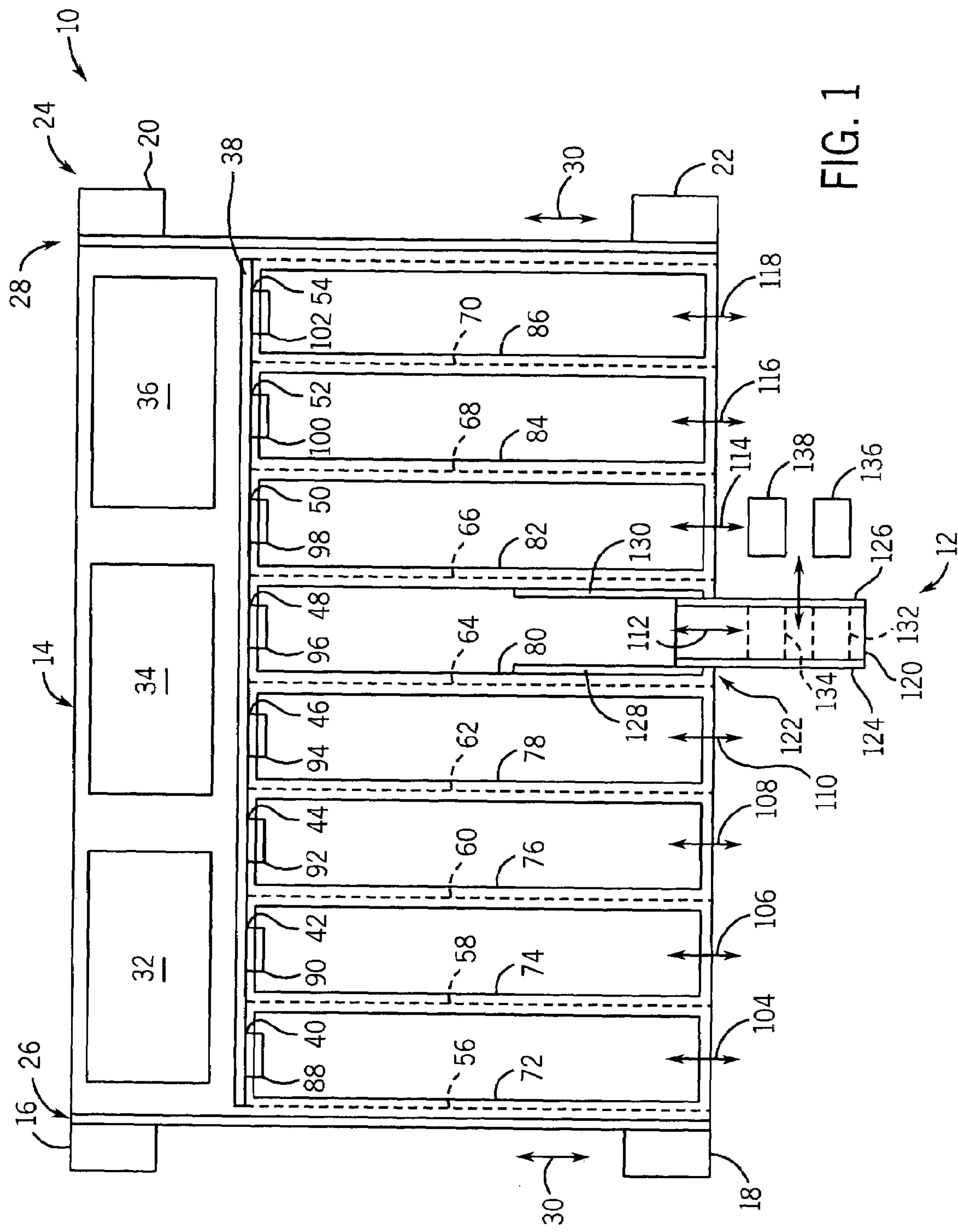
FIG. 1 is a block diagram illustrating a top view of a rack-mount computer system having a hot plug fan assembly in accordance with embodiments of the present invention.

FIG. 1 is a block diagram illustrating a top view of a rack-mount computer system 10 having a hot plug fan assembly 12 in accordance with embodiments of the present invention. As discussed in further detail below, the hot plug fan assembly 12 facilitates fan removal and replacement during operation of the rack-mount computer system 10, thereby reducing downtime and improving reliability of the rack-mount computer system 10. As illustrated, the rack-mount computer system 10 comprises a rack-mount multi-server enclosure or removable component housing 14, such as a blade server chassis, which is mounted to legs or rails 16, 18, 20, and 22 of a rack 24. For example, the removable component housing 14 may be removably or slidably coupled to the rack 24 by a pair of rail mechanisms 26 and 28. Thus, the removable component housing 14 may be inserted in and withdrawn from the rack 24 as indicated by arrows 30. In certain embodiments, the removable component housing 14 comprises a blade server chassis, such as the ProLiant BL series blade server chassis by Hewlett Packard Company of Palo Alto, Calif.

Inside, the removable component housing 14 comprises a variety of components and circuitry, which are shared among a plurality of removable server modules or modular components. In the illustrated embodiment, the removable component housing 14 has shared components 32, 34, 36, and 38, which include a variety of circuitry and devices. For example, the illustrated shared component 38 includes one or more shared circuit boards, such as mid-plane or backplane boards, which are aligned with one another. In the illustrated embodiment, the shared component 38 includes a signal backplane board and a power distribution backplane board. The signal backplane board functions to facilitate data transfer among the various modular components (e.g., components 72-86) within the component housing 14. The power distribution backplane board functions to distribute power among the various modular components (e.g., components 72-86) within the component housing 14. In addition, the components 32, 34, and 36 include a variety of circuitry and devices, which are disposed behind the one or more shared circuit boards 38. For example, certain embodiments of the shared components 32, 34, and 36 may comprise a blade management module and a variety of data interface modules. The blade management module connects to the signal backplane board 38, such that the plurality of modular components (e.g., components 72-86) can be connected together with a power distribution chassis (not shown). The data interface modules connect with switch boxes, such as modular components 72 and 86). These data interface modules depend on the type of peripheral that is receiving data from the switch boxes.

The one or more shared circuit boards 38 also have a plurality of connectors, such as mechanical, power, and data communication connectors, for selective integration of removable server modules or modular components into the removal component housing 14. For example, in the illustrated embodiment, the shared circuit board 38 comprises connectors 40, 42, 44, 46, 48, 50, 52, and 54, which are positioned within component receptacles 56, 58, 60, 62, 64, 66, 68, and 70, respectively. As illustrated, removable server modules or modular components 72, 74, 76, 78, 80, 82, 84, and 86 are coupled to the connectors 40, 42, 44, 46, 48, 50, 52, and 54 by means of mating connectors 88, 90, 92, 94, 96, 98, 100, and 102, respectively. Each of these connectors 40-54 and mating connectors 88-102 may represent both power connectors and data signal connectors, as recognized by one of ordinary skill in the art. In certain embodiments, the modular components 72 through 86 comprise switch modules and blade servers, such as the ProLiant BL series blade servers by Hewlett Packard Company of Palo Alto, Calif. In operation, the modular components 72, 74, 76, 78, 80, 82, 85, and 86 may cooperate with one another and with circuitry disposed on the shared circuit board 38 and the shared components 32, 34, and 36. For example, the shared components 32, 34, and 36 and shared circuit board 38 may comprise lights out management circuitry, network circuitry, security circuitry, and so forth.

In addition, the modular components 72, 74, 76, 78, 80, 82, 84, and 86 may comprise a variety of switches, peripheral devices, and server technologies and functionalities, such as a web server, an application server, and so forth. Therefore, as indicated by arrows 104, 106, 108, 110, 112, 114, 116, and 118, the modular components 72, 74, 76, 78, 80, 82, 84, and 86 may be selectively mounted and dismounted from the component receptacles 56, 58, 60, 62, 64, 66, 68, and 70 to provide the desired functionality within the removable component housing 14. For example, a variety of fasteners may be used to secure the modular components 72-86 in and to the component receptacles 56-70. If a different component is desired in the removable component housing 14, then these fasteners may be disengaged to permit the insertion of a different modular component. In certain embodiments, the modular components 72-86 may be slidingly mounted in and to the component receptacles 56-70.

Moreover, one or more of the modular components 72, 74, 76, 78, 80, 82, 84, and 86 may comprise the hot plug fan assembly 12, which is shown coupled to the modular component 80 in FIG. 1. In the illustrated embodiment, the hot plug fan assembly 12 comprises a fan tray or carrier 120 insertable and extendable from a front portion 122 of the modular component 80. As illustrated, the fan tray or carrier 120 is disposed in an extended position at which the fan tray or carrier 120 extends from the front portion 122 of the modular component 80. Thus, the illustrated fan tray or carrier 120 remains coupled to the modular component 80 in both the inserted position and the extended position. Although the fan tray or carrier 120 may have a variety of positioning mechanisms, the illustrated fan tray or carrier 120 includes rail mechanisms 124 and 126 that are slidable along mating rail mechanisms 128 and 130 within the modular component 80. The illustrated fan tray or carrier 120 also comprises a plurality of fan receptacles, such as hot plug fan receptacles 132 and 134, to receive a plurality of fans such as hot plug fans 136 and 138, respectively. These fans 136 and 138 are selectively insertable into and removable from the fan receptacles 132 and 134 while the fan tray or carrier 132 extends from the modular component 80 in the extended position. As illustrated, the hot plug fans 136 and 138 are disposed in a removed position relative to the hot plug fan receptacles 132 and 134, respectively.

In view of these features, the hot plug fan assembly 12 facilitates selective insertion and removal of the hot plug fans 136 and 138 without removing the modular component 80 from the removable component housing 14. In addition, the fan tray or carrier 120 retracts into the modular component 80 and connectedly extends from the modular component 80 in a space in front of the modular component 80, such that fan tray or carrier 132 does not interfere with the adjacent components 72, 74, 76, 78, 82, 84, and 86 in the removable component housing 14 or other rack mount components (not shown) above or below the removable component housing 14. This front-removal feature of the fan tray or carrier 132 also ensures that the hot plug fans 136 and 138 continue to provide airflow through the modular component 80 in the extended position of the fan tray or carrier 132. As discussed in further detail below, the hot plug fans 136 and 138 are removable laterally from the fan tray or carrier 132 in front of the removable component housing 14, such that removal and insertion of the hot plug fans 136 and 138 does not extend above or below the rack space of the removable component housing 14. Alternatively, the fan tray or carrier 132 may pivot or rotate outwardly from the modular component 80, while a duct routes airflow from the hot plug fans 136 and 138 continuously into the modular component 80.

Figure 2:
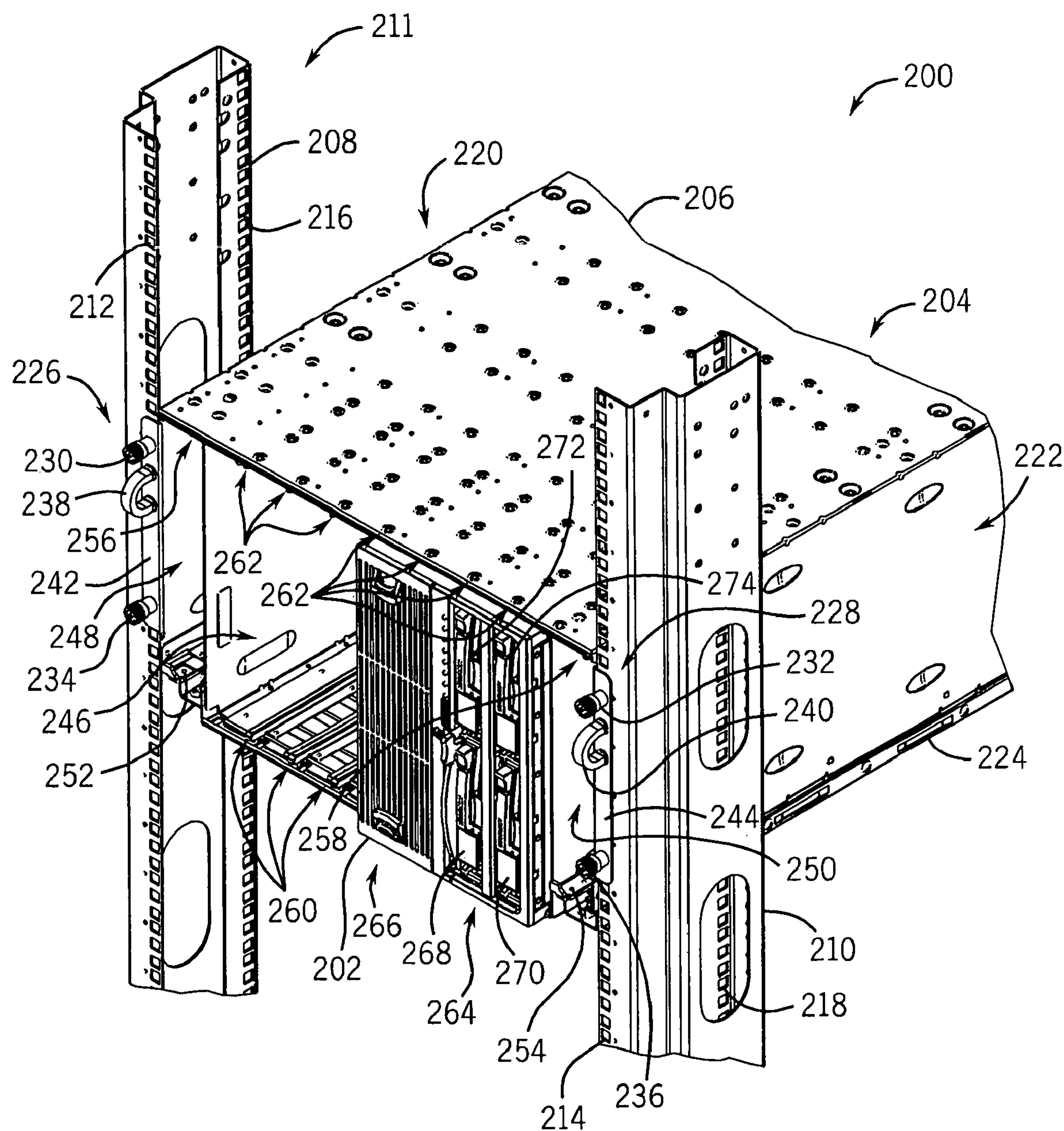
FIG. 2 is a perspective view of a rack-mount computer system having a hot plug fan assembly disposed in a multi-server enclosure in accordance with embodiments of the present invention.

FIG. 2 is a perspective view of a rack-mount computer system 200 having a hot plug fan assembly 202 disposed within a multi-server assembly 204 in accordance with embodiments of the present invention. As illustrated, the multi-server assembly 204 comprises a rack-mount multi-server enclosure or removable component housing 206, which is mounted to front legs or rails 208 and 210 of a rack 211. In certain embodiments, the removable component housing 206 comprises a blade server chassis, such as the ProLiant BL series blade server chassis by Hewlett Packard Company of Palo Alto, Calif.

In the illustrated rack 211, the front legs or rails 208 and 210 each have a plurality of front mounting receptacles 212 and 214 and a plurality of lateral mounting receptacles 216 and 218, respectively. At opposite sides 220 and 222 of the removable component housing 206, a pair of rails 224 are slidingly mounted to the lateral mounting receptacles 216 and 218 of the front legs or rails 208 and 210, respectively. Therefore, the multi-server assembly 204 can be moved along the pair of rails 224 horizontally between an inserted position (as illustrated) and an extended position relative to the rack 211.

In addition, the removable component housing 206 comprises releasable mounting mechanisms 226 and 228 disposed on the opposite sides 220 and 222, respectively. In the illustrated embodiment, each of the releasable mounting mechanisms 226 and 228 comprise mounting fasteners 230 and 232, mounting fasteners 234 and 236, and grips 238 and 240 disposed on outer lips or flanges 242 and 244, respectively. In the inserted position of FIG. 2, the removable component housing 206 is removably coupled to the front legs or rails 208 and 210 by engagement of the mounting fasteners 230 and 232 and the mounting fasteners 234 and 236 with the front mounting receptacles 212 and 214, respectively. For example, the mounting fasteners 230, 232, 234 and 236 may comprise a variety of tool-free and tool-type fastening mechanisms, such as threaded fasteners, latches, hooking mechanisms, thumb screws, and so forth. If these mounting fasteners 230, 232, 234, and 236 are disengaged from the front mounting receptacles 212 and 214, then the grips 238 and 240 may be engaged to pull the removable component housing 206 outwardly from the rack 211 along the pair of rails 224.

Inside the removable component housing 206, the multi-server assembly 204 comprises a variety of shared components and circuitry, such as a shared signal backplane, a shared power distribution backplane, a shared blade management module, and shared data interface modules. In addition, the removal component housing 206 has a plurality of receptacles to receive modular or removable components, such as servers, switches, input/output devices, and so forth. For example, input/output devices may comprise a floppy disk drive, a Compact Disk (CD) drive, a Digital Video Disk (DVD) drive, a tape drive, a network interface, a peripheral interface (e.g., keyboard or mouse), or any other desired input/output port or mechanism. In the illustrated embodiment, the removable component housing 206 comprises a plurality of central component receptacles 246 and a pair of lateral component receptacles 248 and 250. As discussed below, the illustrated receptacles 246 can support blade servers (e.g., components 264 and 266), while the receptacles 248 and 250 can support switch boxes (not shown). The lateral component receptacles 248 and 250 have a variety of mounting mechanisms, such as lower rail mechanisms 252 and 254 and upper rail mechanisms 256 and 258, respectively. Similarly, the central component receptacles 246 have a variety of mounting mechanisms, such as lower rail mechanisms 260 and upper rail mechanisms 262. Therefore, each of the component receptacles 246, 248 and 250 is adapted to mount removable components in a vertical manner within the removable component housing 206.

In addition, the open configuration of the central component receptacles 246 permits it to accommodate a variety of dimensions of components, such as components spanning one or more of the lower and upper rail mechanisms 260 and 262. In the illustrated embodiment, each of a pair of removable server modules or modular components 264 and 266 is removably and slidingly mounted to a pair of the lower rail mechanisms 260 and a pair of the upper rail mechanisms 262, respectively. Thus, each of these modular components 264 and 266 spans two spaces within the central component receptacles 246.

In certain embodiments, these removable server modules or modular components 264 and 266 may comprise blade servers, which have a variety of components and features that cooperate with one another and the various shared components and circuitry within the multi-server assembly 204. For example, the removable server modules or modular components 264 and 266 may comprise a web server, an application server, a file server, a management server, a security server, and so forth. In certain embodiments, the modular components 264 and 266 comprise blade servers, such as the ProLiant BL series blade servers by Hewlett Packard Company of Palo Alto, Calif.

In addition, each of these removable server modules or modular components 264 and 266 may have a variety of removable components, such as hot plug fans, hot plug power modules, hot plug hard drives and memory devices, and so forth. For example, the modular component 264 has a plurality of removable or hot plug hard drives 268, 270, 272, and 274. By further example, the modular component 266 comprises the hot plug fan assembly 202, which facilitates removal, servicing, insertion, and replacement of one or more hot plug fans during operation of the modular component 266, the multi-server assembly 204, and the overall rack-mount computer system 200.

Figure 3:
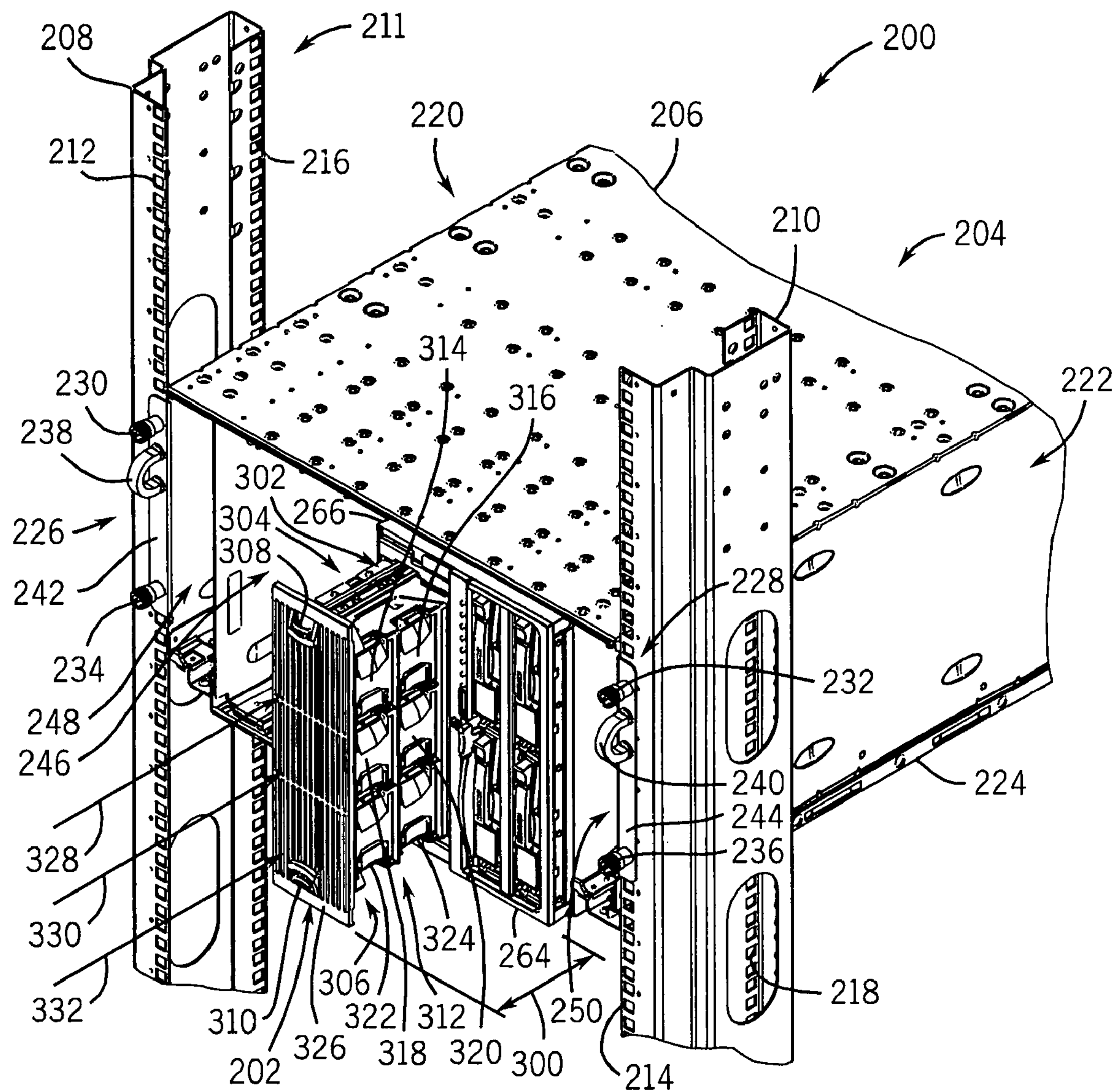
FIG. 3 is a perspective view of the rack-mount computer system of FIG. 2 illustrating the hot plug fan assembly extended from a removable component disposed within the removable component housing in accordance with embodiments of the present invention.

FIG. 3 is a perspective view of the rack-mount computer system 200 of FIG. 2 illustrating the hot plug fan assembly 202 disposed in an extended position 300 in accordance with embodiments of the present invention. In this extended position 300, the hot plug fan assembly 202 connectedly extends from the removable server module or modular component 266 along a pair of opposite rail assemblies 302, which are disposed along upper and lower sides 304 and 306 of the hot plug fan assembly 202 and into the interior of the modular component 266. Thus, in the illustrated embodiment, the opposite rail assemblies 302 slidingly connect and support the hot plug fan assembly 202 to the modular component 266, such that the hot plug fan assembly 202 can be at least partially extended but not disconnected from the modular component 266.

As discussed in further detail below, the hot plug fan assembly 202 also has a fastener and release mechanism to mount the hot plug fan assembly 202 removably into the modular component 266, as illustrated in FIG. 2. For example, the hot plug fan assembly 202 has a pair of releases 308 and 310 disposed along the upper and lower sides 304 and 306, respectively. These releases 308 and 310 are coupled to couplings or latches (not shown), which engaging mating couplings (not shown) within the modular component 266. Thus, the hot plug fan assembly 202 can be attached and detached without the use of tools, thereby facilitating quick extraction and retraction of the hot plug assembly 202 relative to the modular component 266.

Between the opposite rail assemblies 302, the hot plug fan assembly 202 also comprises a fan tray or carrier 312 having a plurality of fan receptacles to receive fans, such as fans 314, 316, 318, 320, 322, and 324. In the illustrated embodiment, the fans 314 through 324 are disposed to provide both serial and parallel air flow paths through the fan tray or carrier 312. Accordingly, fans 314 and 316 are disposed in a serial flow path to draw air through an outer air grill 326 and into the modular component 266, as indicated by arrow 328. Arranged to provide a parallel flow path with the fans 314 and 316, the serially disposed fans 318 and 320 pull air through the grill 326 and into the modular component 266, as indicated by arrow 330. Finally, in parallel with both the fans 314 and 316 and the fans 318 and 320, the serially disposed fans 322 and 324 pull air through the grill 326 and into the modular component 266, as indicated by arrow 332. Accordingly, this configuration of the fans 314-324 provides serial and parallel air flow paths, which ensures continuous airflow into the modular component 266 in the event one of the fans 314-324 fails to operate properly. Moreover, the orientation of the airflow ensures that the fans 314-324 continue to cool the modular component 266 regardless of the extended or inserted position of the hot plug fan assembly 202 relative to the modular component 266. The rail assemblies 302 secure the fan tray or carrier 312 to the modular component while permitting the fan tray to be moved between a retracted position within the modular component and the extended position 300 in which it projects from the front of the multi-server assembly 204.

Figure 4:
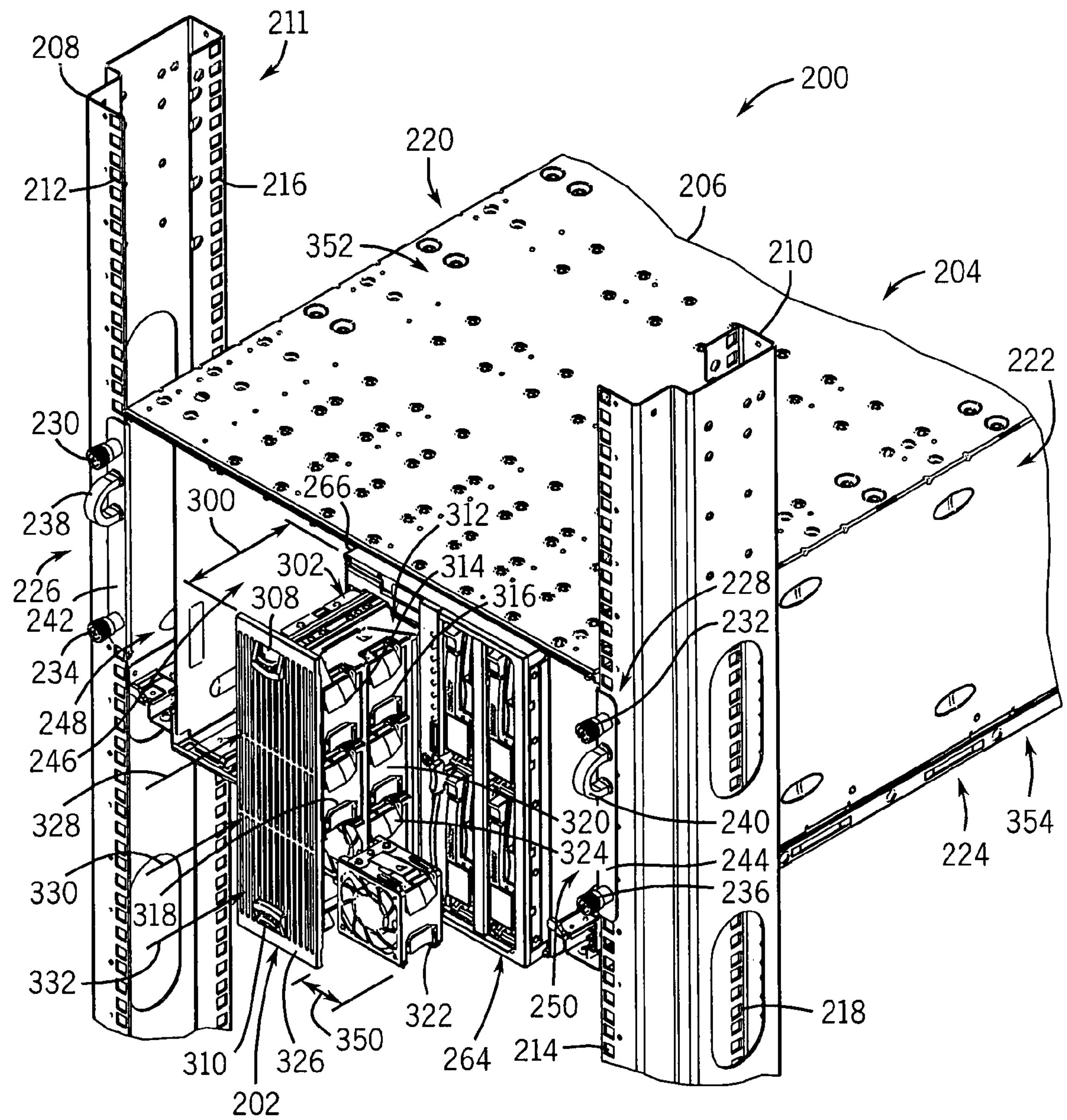
FIG. 4 is a perspective view of the rack-mount computer system of FIGS. 2 and 3 illustrating a fan removed from the hot plug fan assembly in the extended position in accordance with embodiments of the present invention.

FIG. 4 is a perspective view of the rack-mount computer system 200 of FIGS. 2 and 3 illustrating the hot plug fan assembly 202 disposed in the extended position 300 and the fan 322 disposed in a removed position 350 in accordance with embodiments of the present invention. As noted above, any one of the fans 314-324 may be inserted, removed, serviced, replaced, or otherwise exchanged within the fan tray or carrier 312 of the hot plug fan assembly 202, as indicated by the fan 322 of FIG. 4. In operation, the remaining fans 314, 316, 318, 320, and 324 provide continuous airflow through the fan assembly 202 and the modular component 266 regardless of the position of the fan 322 in the removed position 350. For example, the sequential or series positioning of the fans 322 and 324 within the fan tray or carrier 312 ensures that the airflow 322 continues despite the removal or failure of one of the two fans 322 and 324, i.e., the fan 322 disposed in the removed position 350.

In addition, the configuration of the fan tray or carrier 312 ensures that the insertion, removal, or replacement of any one of the fans 314-324 can be effected from in front of the multi-server assembly 204, i.e., between the opposite sides 220 and 222 and between the top and bottom sides 352 and 354 of the removable component housing 206. Therefore, the hot swapping or exchange of the fans 314-324 does not extend into the space of adjacent rack-mounted component above or below the multi-server assembly 204.

Figure 5:
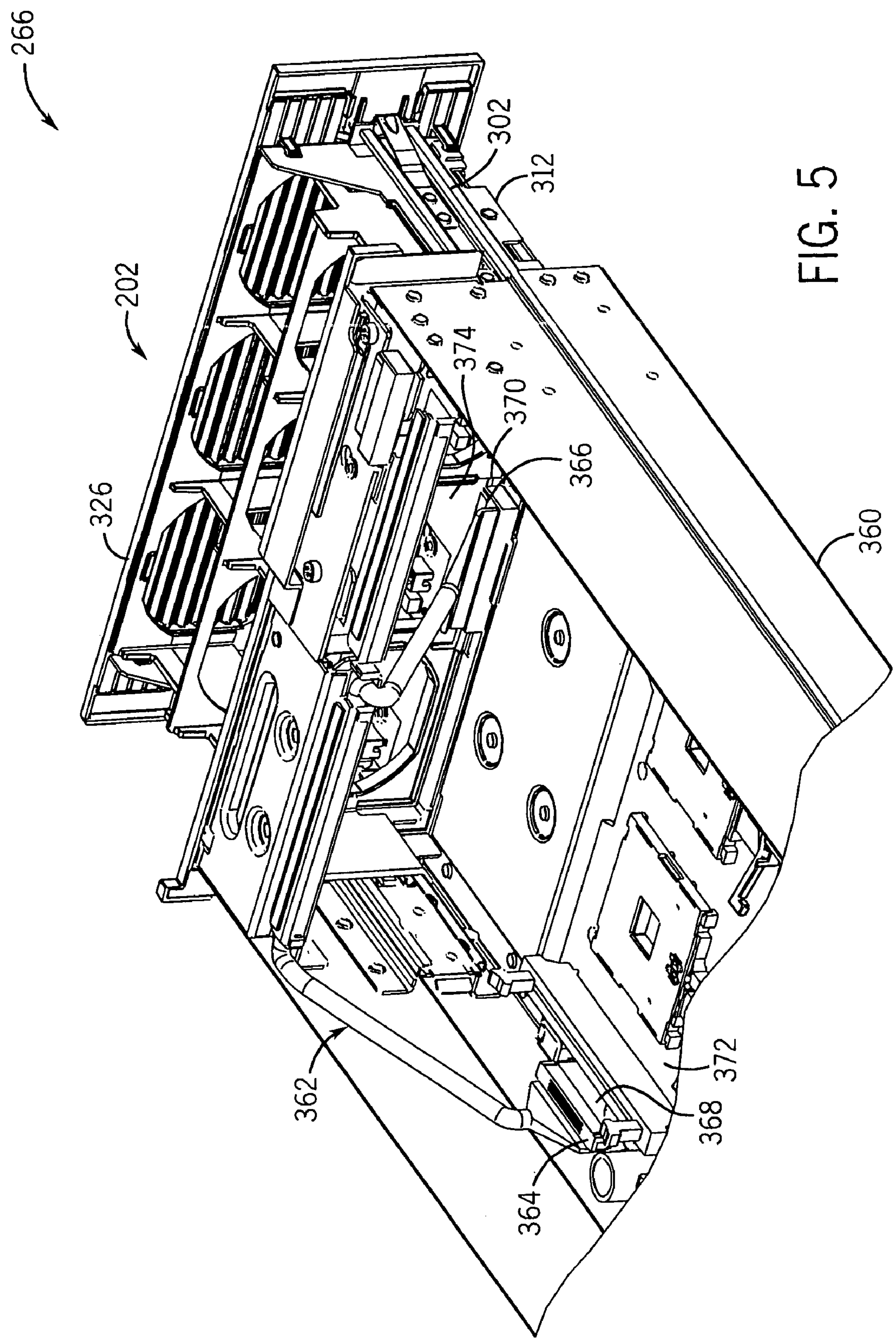
FIG. 5 is a perspective view of the removable component having the hot plug fan assembly in the extended position in accordance with embodiments of the present invention.

FIG. 5 is a partial internal perspective view of the removable server module or modular component 266 illustrating the cabling between the hot plug fan assembly 202 and a server or component chassis 360 of the modular component 266 in accordance with embodiments of the present invention. In the illustrated embodiment, the modular component 266 comprises a fan tray cable 362 having opposite connectors 364 and 366, which are coupled to connectors 368 and 370 of a server or component board 372 and a fan board 374, respectively. To facilitate continuous operation of the hot plug fan assembly 202, the illustrated fan tray cable 362 is extendable and retractable with movement of the fan tray or carrier 312 between extended and inserted positions relative to the server or component chassis 360. As discussed above, the illustrated embodiment of the fan tray or carrier 312 remains connected to the modular component 266 in both the extended and inserted positions. Therefore, the removable server module or modular component 266 also may have a variety of hardware and software to facilitate hot plugging, hot replacing, and hot swapping of the various fans 314-324 with respect to the fan tray or carrier 312 of the hot plug fan assembly 202. For example, one or both of the boards 372 and 374 may have circuitry to facilitate hot plugging, hot replacing, and hot swapping. Accordingly, in the illustrated embodiment, the removable server module or modular component 266 may continue to operate without downtime while one or more of the fans 314-324 is removed, serviced, or generally swapped with respect to the fan tray or carrier 312.

Figure 6:
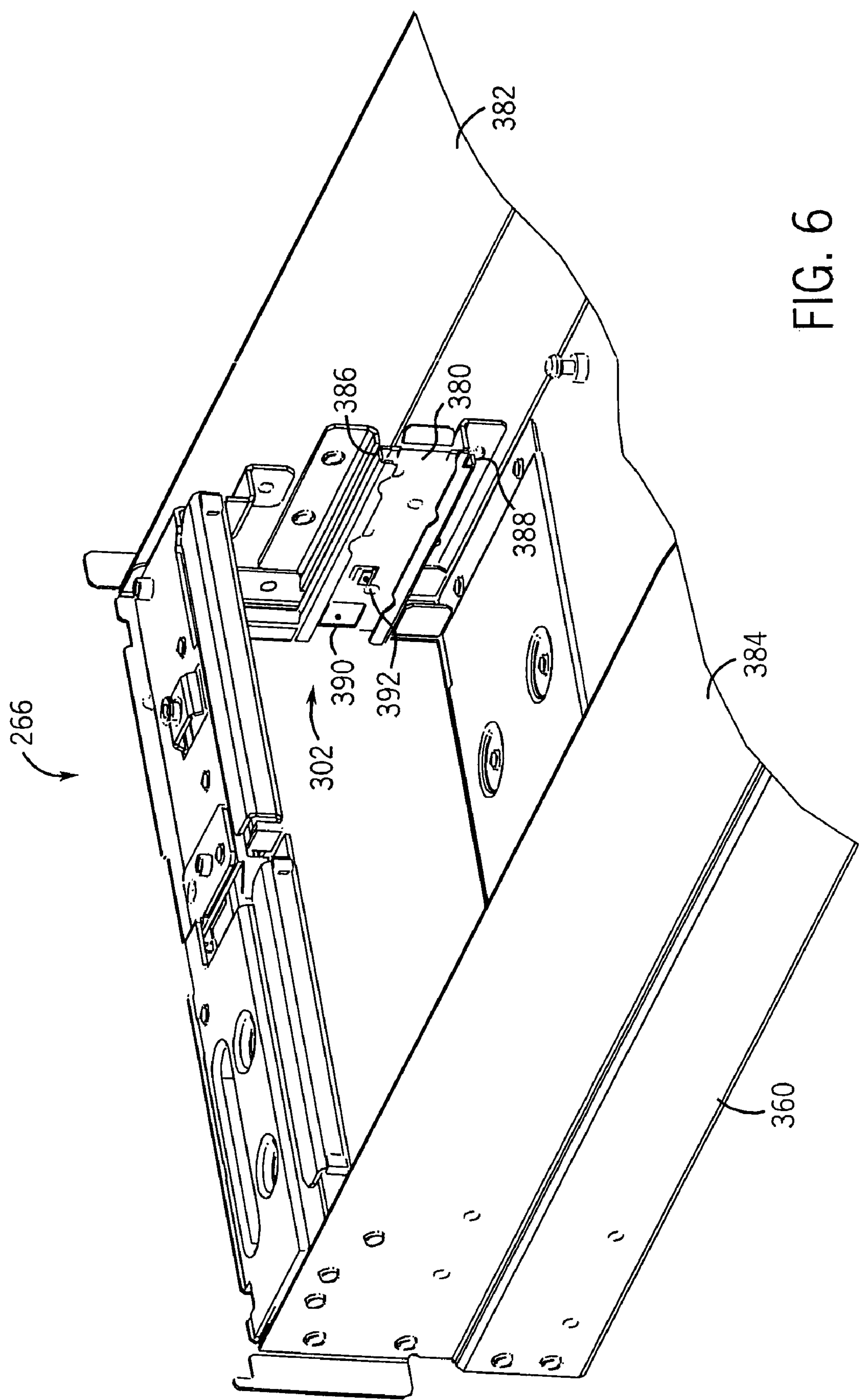
FIG. 6 is a perspective view of the removable component illustrating internal mounting features for the hot plug fan assembly in accordance with embodiments of the present invention.

Turning now to the mechanical connection features of the removal server module or modular component 266, the rail assembly 302 is further illustrated with reference to FIGS. 6 and 7. Specifically, FIG. 6 is a partial internal perspective view of the server or component chassis 360 of FIG. 5, illustrating a pair of rails 380 disposed on opposite sides 382 and 384 on the chassis 360 in accordance with embodiments of the present invention. As illustrated, the rails 380 of the rail assembly 302 have outer slots or U-shaped rail portions 386 and 388 extending horizontally along the sides 382 and 384. In addition, each of the rails 380 has a front lip or recessed catch 390 and an intermediate slot or projecting catch 392.

Figure 7:
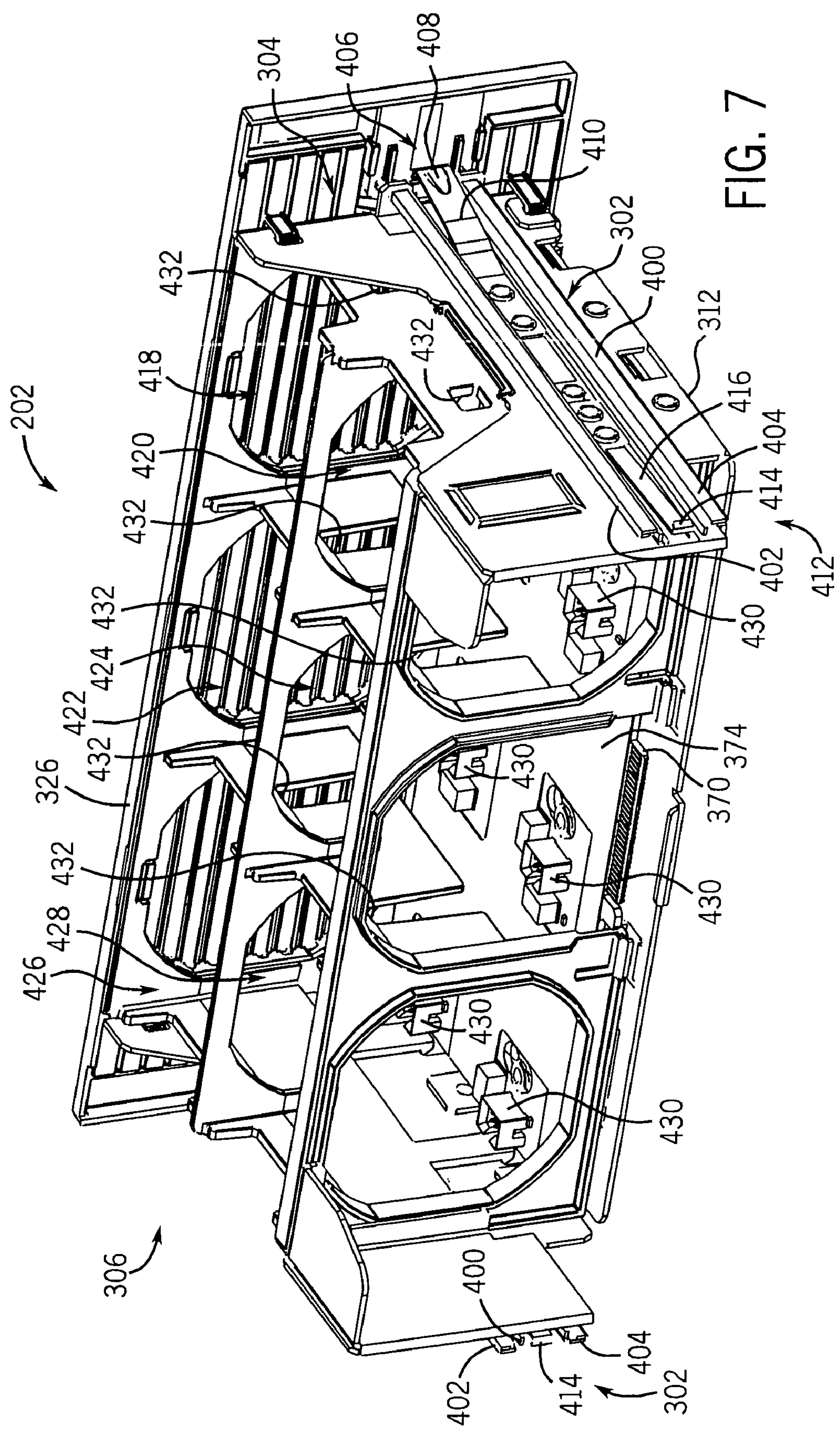
FIG. 7 is a perspective view of the hot plug fan assembly illustrating internal mounting components for the removable fan in accordance with embodiments of the present invention.

These mechanical connection features are best understood with further reference to FIG. 7, which is a rear perspective view of the hot plug fan assembly 202 in accordance with embodiments of the present invention. In the fan tray or carrier 312 of FIG. 7, the rail assembly 302 comprises a pair of rails 400 disposed on the opposite sides 304 and 306. As illustrated, the pair of rails 400 each comprise outer projections or L-shaped rail portions 402 and 404 extending horizontally along the length of the fan tray or carrier 312. When the fan tray or carrier 312 is installed in the modular component 266, these L-shaped rail portions 404 slidably engage the outer slots or U-shaped rail portions 386 and 388 of the opposite rails 380 disposed within the server or component chassis 360 (see FIG. 6). Therefore, the rails 380 (see FIG. 6) and the rails 400 (see FIG. 7) of the rail assembly 302 (see FIG. 3) facilitate horizontal movement between the hot plug fan assembly 202 and the server or component chassis 360.

In addition, the opposite rails 400 of FIG. 7 have a front latch mechanism 406, which comprises a latch 408 disposed on a resilient member 410. Thus, the resilient member 410 is movable inward and outward relative to the rail 400 to position the latch 408 into or out of engagement with the front lip or recessed catch 390 (see FIG. 6) of the rail 380 within the server or component chassis 360. For example, if the hot plug fan assembly 202 is inserted into the server or component chassis 360 as illustrated in FIG. 2, then the resilient member 410 biases the latch 408 (see FIG. 7) into the front lip or recessed catch 390 (see FIG. 6) to prevent extraction of the hot plug fan assembly 202 from the server or component chassis 360. However, engagement of the releases 308 and 310 (see FIGS. 2 and 3) moves the resilient members 410 and the latches 408 (see FIG. 7) out of engagement with the front lips or recessed catches 390 (see FIG. 6), thereby enabling the hot plug fan assembly 202 to be slidingly removed from the server or component chassis 360 along the rail assemblies 202 (see FIG. 3).

As further illustrated in FIG. 7, each of the opposite rails 400 has a rear stop mechanism 412, which comprises a stop or hook 414 disposed on a resilient member 416. Again, the resilient members 416 bias the stops or hooks 414 outwardly from the rails 400, such that the stops or hooks 414 slide into or catch with the slots or projecting catches 392 of the rails 380 (see FIG. 6). Therefore, the engagement between the hooks 414 and the projecting catches 392 restricts movement of the rails 400 (see FIG. 7) and fan tray or carrier 312 beyond the end of the rails 380 (see FIG. 6). For example, the engagement between the hooks 414 and the projecting catches 392 may restrict the extended distance of the hot plug fan assembly 202 to the extended position 300, as illustrated in FIG. 3. However, the resilient members 416 may be depressed to release these hooks 414 from the projecting catches 392, such that the fan tray or carrier 312 can be mechanically disconnected from the modular component 266. In turn, the cable 362 can be disconnected at connectors 366 and 370 (see FIG. 5), such that the fan tray or carrier 312 can be electrically disconnected from the modular component 266.

Turning now to the mounting configuration of fans 314-324, the fan tray or carrier 312 of FIG. 7 comprises a flow passage having a plurality of fan receptacles 418, 420, 422, 424, 426, and 428, which receive the fans 314, 316, 318, 320, 322, and 324 illustrated in FIGS. 3 and 4. Within each of these fan receptacles 418-428, the fan tray or carrier 312 also has a fan connector 430 coupled to the fan board 374. Accordingly, these fan connectors 430 facilitate hot plugging, hot swapping, and hot replacing the various fans 314-324 within the fan receptacles 418-428 of the hot plug fan assembly 202. In addition, each of the fan receptacles 418-428 has a mechanical mounting mechanism to facilitate removable attachment of the fans 314-324 with the fan tray or carrier 312. In the illustrated embodiment, each of the fan receptacles 418-428 has a recess or latch mating structure 432, which is removably engageable with a fastening structure of the fans 314-324, as discussed in further detail below.

Figure 8:
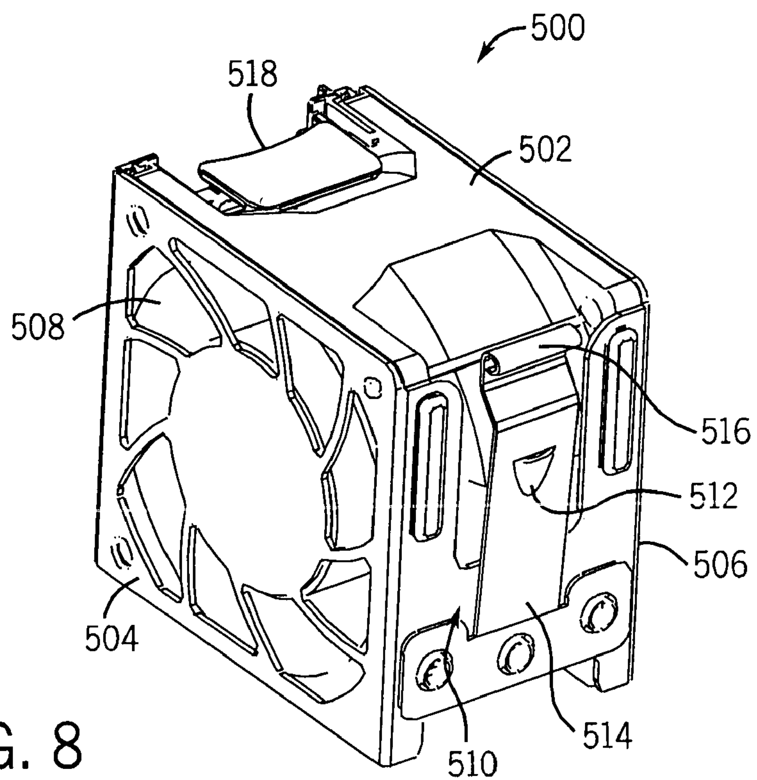
FIGS. 8 and 9 are perspective views of the removable fan illustrating latching features in accordance with embodiments of the present invention.
Figure 9:
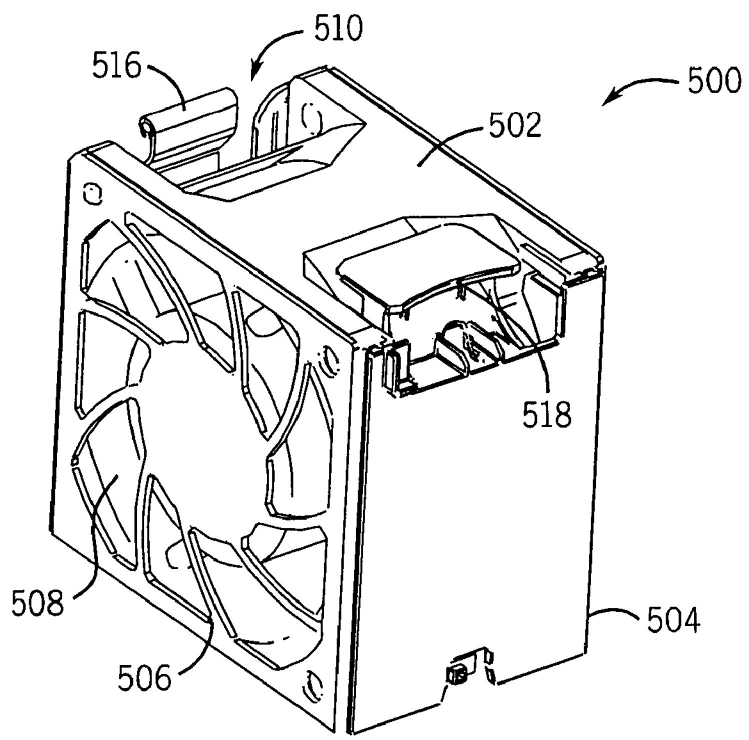

FIGS. 8 and 9 are perspective views of a fan 500 in accordance with embodiments of the present invention. For example, any one of the fans 136, 138, 314, 316, 318, 320, 322, and 324 illustrated in FIGS. 1, 3, and 4, may comprise the features of the illustrated fan 500. The illustrated fan 500 comprises a modular body or housing 502, a pair of opposite air grills 504 and 506, and an internal motorized rotary fan 508 disposed within the housing 502. In addition, the fan 500 comprises a mounting and release mechanism to facilitate removable mounting into the fan receptacles 418-428 of the fan tray or carrier 312, as illustrated in FIG. 7. In the illustrated embodiment of FIGS. 8 and 9, the fan 500 comprises a fastening mechanism 510 having a projecting catch or latching tab 512 disposed along a resilient member 514 coupled to the housing 502. Thus, the projecting catch or latching tab 512 is biased outwardly from the housing 502 by the resilient member 514, thereby forcing the latching tab 512 into engagement with the recess or latch mating structure 432 within the receptacles 418-428 of the hot plug fan assembly 202 of FIG. 7.

The illustrated fan 500 of FIGS. 8 and 9 also has a graspable release portion 516 disposed on the resilient member 514, such that a user may bias the resilient member 514 and the latching tab 512 inwardly toward the housing 502 and out of engagement with the recess or latch mating structures 432 of the hot plug fan assembly 202. On an opposite side from the fastening mechanism 510, the fan 500 also may have an opposite grip 518 to complement the graspable release portion 516, thereby facilitating removal of the fan 500 from the respective receptacle 418-428 of the hot plug fan assembly 202.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A system, comprising:

a rack;

a housing mounted in the rack, wherein the housing comprises a plurality of modular component receptacles;

a modular component disposed in at least one of the plurality of modular component receptacles wherein the modular component comprises a blade server; and a fan tray vertically mounted directly to the modular component, with respect to the rack, wherein the fan tray is moveable with respect to the modular component to an extended position extending from the modular component, the fan tray comprises a plurality of fans that are removable from the fan tray in the extended position and the plurality of fans are hot pluggable and hot replaceable.

2. The system of claim 1, wherein the rack comprises a computer rack mount structure.

3. The system of claim 1, wherein the housing comprises a plurality of servers disposed in the plurality of modular component receptacles.

4. The system of claim 1, wherein the modular component comprises a blade server.

5. The system of claim 1, comprising a first rail coupled to the fan tray and a second rail coupled to the modular component, wherein the first rail is slidingly mated with the second rail.

6. The system of claim 1, wherein at least two of the plurality of fans are mounted to define a serial airflow path within the fan tray.

7. The system of claim 1, wherein at least two of the plurality of fans are mounted to define parallel airflow paths within the fan tray.

8. The system of claim 1, wherein in the extended position, the fan tray extends from a front surface of the modular component.

9. The system of claim 1, wherein the fan tray is vertically mounted within the modular component, with respect to the rack.

10. The system of claim 1, wherein the plurality of fans are hot-pluggable.

11. The system of claim 1, wherein the plurality of fans are hot-replaceable.

12. The system of claim 1, wherein the housing comprises a circuit board having component electrical connectors in each of the plurality of modular component receptacles.

13. The system of claim 1, wherein the fan tray is slidingly mounted in and to the modular component.

14. A system, comprising:

a blade server; and a fan tray mounted directly to the blade server, the fan tray enclosure, comprising:

a chassis comprising a plurality of removable fans; and a rail mount structure coupled to the chassis and the blade server such that the chassis is slidingly movable between a retracted position at which the chassis is retracted within the blade server and an extended position at which the chassis extends from the blade server.

15. The system of claim 14, wherein the fan tray comprises a latch and release mechanism adapted to secure the fan tray in the retracted position within the blade server.

16. The system of claim 14, wherein the rail mount structure comprises a pair of rails disposed on opposite sides of the chassis about a plurality of receptacles supporting the plurality of removable fans.

17. The system of claim 14, wherein the plurality of removable fans comprise latching members engaged with latch mating structures disposed in the chassis.

18. The system of claim 14, wherein the extended position is substantially in front of the server enclosure.

19. The system of claim 14, wherein the fan tray comprises a plurality of hot-plug electrical connectors for the plurality of removable fans and a fan cable that is retractable and extendable between the retracted and extended positions of the chassis.

20. The system of claim 14, wherein the fan tray comprises a flow passage for the plurality of fans that continuously directs airflow through the blade server in both the retracted and extended positions of the chassis.

21. The system of claim 14, wherein the blade server is configured to mount in a multi-server enclosure, and wherein the multi-server enclosure is configured to mount in a rack.

22. A system, comprising:

a blade server and comprising a fan tray mounted directly within a receptacle in the blade server, wherein the fan tray is movable between a retracted position at which the fan tray is disposed within the receptacle the blade server and an extended position at which the fan tray extends from a front of the blade server at least partially out of the receptacle in the blade server, wherein the fan tray comprises a flow passage having fan receptacles adapted to support removable fans such that the removable fans continuously provide airflow through the flow passage and through the blade server in both the both the retracted and extended positions, and wherein the fan tray comprises a rail mounting mechanism.

23. The system of claim 22, wherein the plurality of fans are mounted to define at least two serial airflow paths that are parallel to one another within the fan tray.

24. The system of claim 22, wherein the plurality of fans are hot pluggable, hot-replaceable, or a combination of thereof.

25. The system of claim 22, wherein the blade server is configured to mount in a multi-server enclosure, and wherein the multi-server enclosure is configured to mount in a rack.

26. A method of manufacture, comprising:

mounting a fan tray directly within a receptacle in a blade server wherein the fan tray is movable between a retracted position at which the fan tray is disposed within the blade server and an extended position at which the fan tray extends from a face of the blade server partially out of the receptacle in the blade server, the fan tray comprises a plurality of fan receptacles.

27. The method of claim 26, comprises forming the fan tray to include a chassis having the plurality of fan receptacles and a pair of rail mounting mechanisms.

28. The method of claim 26, comprising assembling a plurality of fan modules in the respective fan receptacles in the fan tray in a flow passage adapted to direct airflow continuously through the blade server.

29. The method of claim 26, wherein mounting the fan tray comprise slidingly mounting fan tray in the receptacle of the blade server.

30. The method of claim 29, comprising supporting a plurality of blade servers in a rack mountable enclosure, wherein the plurality of blade servers include the blade server having the fan tray.

31. The method of claim 30, comprising mounting a rack mountable enclosure in the rack.

32. The method of claim 31, comprising and mounting a plurality of rack components in the rack in vertical spaces adjacent the rack mountable enclosure.

33. The system of claim 22, comprising:

a rack; and a blade server chassis mounted to the rack and housing the blade server, wherein the blade server chassis is configured to house a plurality of blade servers.

* * * * *

UNITED STATES PATENT AND TRADEMARK OFFICE
CERTIFICATE OF CORRECTION

PATENT NO. : 7,408,772 B2
APPLICATION NO. : 10/846031
DATED : August 5, 2008
INVENTOR(S) : John R. Grady et al.

It is certified that error appears in the above-identified patent and that said Letters Patent is hereby corrected as shown below:

Title Pg, Item (54) Title, after "FAN TRAY" insert -- FOR --.

Title Pg, Item (56), under "U.S. Patent Documents", in column 2, line 2, below "6,665,179 B2* 12/2003 Chou 361/687" insert -- 6,680,846 1/2004 Smith et al. --.

In column 1, in "Title", line 1, after "FAN TRAY" insert -- FOR --.

In column 10, line 32, in Claim 14, after "server" insert -- , --.

In column 10, line 63, in Claim 22, after "tray is" delete "movable" and insert -- moveable --, therefor.

In column 10, line 64, in Claim 22, after "the receptacle" insert -- , --.

In column 11, line 4, in Claim 22, after "both the" delete "both the"

In column 11, line 20, in Claim 26, delete "movable" and insert -- moveable --, therefor.

In column 12, line 9, in Claim 29, after "mounting" insert -- the --.

In column 12, line 17, in Claim 32, after "comprising" delete "and".

In column 12, lines 17-18, in Claim 32, after "mounting" delete "a plurality" and insert -- the plurality --, therefor.

Signed and Sealed this

Fourteenth Day of July, 2009

JOHN DOLL
*Acting Director of the United States Patent and Trademark Office*